(12) United States Patent
Kobayashi

(10) Patent No.: US 7,875,144 B2
(45) Date of Patent: Jan. 25, 2011

(54) TRANSFERRING DEVICE AND TRANSFERRING METHOD

(75) Inventor: Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 465 days.

(21) Appl. No.: 12/111,477

(22) Filed: Apr. 29, 2008

(65) Prior Publication Data

US 2008/0279659 A1    Nov. 13, 2008

(30) Foreign Application Priority Data

May 7, 2007    (JP)    ............................. 2007-122303

(51) Int. Cl.
| | |
|---|---|
| B29C 65/48 | (2006.01) |
| B32B 37/12 | (2006.01) |
| B32B 38/00 | (2006.01) |
| B32B 39/00 | (2006.01) |
| B32B 43/00 | (2006.01) |

(52) U.S. Cl. ..................... 156/247; 156/306.3; 156/323; 156/344; 156/391; 156/537; 156/538; 156/539; 156/540; 156/556; 156/580; 156/584

(58) Field of Classification Search ................. 156/247, 156/249, 289, 306.3, 323, 344, 391, 537–540, 156/556, 557, 567, 565, 580, 584
See application file for complete search history.

(56) References Cited

U.S. PATENT DOCUMENTS

| | | | | | |
|---|---|---|---|---|---|
| 4,063,480 | A | * | 12/1977 | Hinzmann | .................... 83/176 |
| 4,449,885 | A | * | 5/1984 | Hertel et al. | ............. 414/416.08 |
| 4,453,757 | A | * | 6/1984 | Soraoka | .................... 294/119.1 |
| 4,553,069 | A | * | 11/1985 | Purser | .................... 315/111.81 |
| 4,630,427 | A | * | 12/1986 | Harper et al. | ................. 53/460 |
| 4,681,213 | A | * | 7/1987 | Winiasz | .................... 198/803.9 |
| 4,715,637 | A | * | 12/1987 | Hosoda et al. | ............. 294/86.4 |
| 4,752,180 | A | * | 6/1988 | Yoshikawa | .................. 414/737 |
| 4,773,687 | A | * | 9/1988 | Bush et al. | .................. 294/64.1 |
| 4,858,980 | A | * | 8/1989 | Dreisig et al. | .............. 294/99.1 |
| 5,001,594 | A | * | 3/1991 | Bobbio | ....................... 361/234 |
| 5,030,308 | A | * | 7/1991 | Sheyon et al. | ............... 156/235 |
| 5,046,909 | A | * | 9/1991 | Murdoch | ..................... 294/113 |
| 5,092,954 | A | * | 3/1992 | Braun et al. | ................. 156/540 |
| 5,112,205 | A | * | 5/1992 | Watanabe et al. | ........... 425/111 |

(Continued)

FOREIGN PATENT DOCUMENTS

JP    10-242249 A    9/1998

(Continued)

*Primary Examiner*—Philip C Tucker
*Assistant Examiner*—Sing P Chan
(74) *Attorney, Agent, or Firm*—Westerman, Hattori, Daniels & Adrian, LLP

(57) ABSTRACT

A transferring device 10 for transferring plate-like members such as a semiconductor wafer and the like among the first table T1, the second table T2 and the third table T3. The transferring device 10 includes a supporting unit 11 provided with a supporting face for a semiconductor wafer W, and a multi joint robot 12 for transferring the supporting unit 11. The supporting face includes a stacked body of adhesive sheets S in which an adhesive layer A is laminated on a sheet base material SB, and transferring among the table T1 through T3 can be performed through sticking and peeling operation between the adhesive sheet S positioned in an outermost layer and the semiconductor wafer W.

10 Claims, 5 Drawing Sheets

U.S. PATENT DOCUMENTS

| | | | | |
|---|---|---|---|---|
| 5,116,210 | A * | 5/1992 | Watanabe et al. | 425/111 |
| 5,336,319 | A * | 8/1994 | Narang et al. | 118/211 |
| 5,356,512 | A * | 10/1994 | Hosokawa | 216/20 |
| 5,382,311 | A * | 1/1995 | Ishikawa et al. | 156/345.54 |
| 5,555,634 | A * | 9/1996 | Uchiyama et al. | 34/78 |
| 5,571,369 | A * | 11/1996 | Dixon et al. | 156/359 |
| 5,605,499 | A * | 2/1997 | Sugiyama et al. | 451/443 |
| 5,625,526 | A * | 4/1997 | Watanabe et al. | 361/234 |
| 5,647,626 | A * | 7/1997 | Chen et al. | 294/87.1 |
| 5,700,046 | A * | 12/1997 | Van Doren et al. | 294/119.1 |
| 5,720,849 | A * | 2/1998 | Yokosuka et al. | 156/571 |
| 5,730,801 | A * | 3/1998 | Tepman et al. | 118/719 |
| 5,765,890 | A * | 6/1998 | Gaylord et al. | 294/65 |
| 5,803,797 | A * | 9/1998 | Piper | 451/182 |
| 5,807,062 | A * | 9/1998 | Schultz et al. | 414/744.2 |
| 5,849,139 | A * | 12/1998 | Miyakawa et al. | 156/556 |
| 5,880,924 | A * | 3/1999 | Kumar et al. | 361/234 |
| 5,888,127 | A * | 3/1999 | Piper et al. | 451/287 |
| 5,891,298 | A * | 4/1999 | Kuroda et al. | 156/344 |
| 5,932,042 | A * | 8/1999 | Gensel et al. | 156/74 |
| 5,934,865 | A * | 8/1999 | Meadows | 414/796.9 |
| 5,955,858 | A * | 9/1999 | Kroeker et al. | 318/568.11 |
| 5,974,689 | A * | 11/1999 | Ferrell et al. | 34/340 |
| 5,989,444 | A * | 11/1999 | Zywno | 216/33 |
| 6,036,426 | A * | 3/2000 | Hillman | 414/331.14 |
| 6,077,026 | A * | 6/2000 | Shultz | 414/744.1 |
| 6,108,189 | A * | 8/2000 | Weldon et al. | 361/234 |
| 6,112,735 | A * | 9/2000 | Farnworth | 125/12 |
| 6,116,848 | A * | 9/2000 | Thomas et al. | 414/754 |
| 6,123,502 | A * | 9/2000 | Adams et al. | 414/752.1 |
| 6,149,758 | A * | 11/2000 | Tsujimoto et al. | 156/344 |
| 6,174,011 | B1 | 1/2001 | Keigler | 294/99.1 |
| 6,224,702 | B1 * | 5/2001 | Kitano et al. | 156/74 |
| 6,231,297 | B1 * | 5/2001 | Hofmeister | 414/744.5 |
| 6,256,187 | B1 * | 7/2001 | Matsunaga et al. | 361/234 |
| 6,257,827 | B1 * | 7/2001 | Hendrickson et al. | 414/805 |
| 6,261,048 | B1 * | 7/2001 | Muka | 414/416.03 |
| 6,271,676 | B1 * | 8/2001 | Montoya | 324/765 |
| 6,279,976 | B1 * | 8/2001 | Ball | 294/64.1 |
| 6,299,404 | B1 * | 10/2001 | Muka et al. | 414/744.5 |
| 6,325,057 | B1 * | 12/2001 | Farnworth | 125/12 |
| 6,340,327 | B1 * | 1/2002 | Afif | 451/444 |
| 6,345,615 | B1 * | 2/2002 | Farnworth | 125/12 |
| 6,364,592 | B1 * | 4/2002 | Hofmeister | 414/217 |
| 6,390,677 | B1 * | 5/2002 | Zywno | 384/12 |
| 6,527,621 | B1 * | 3/2003 | Halley | 451/5 |
| 6,578,893 | B2 * | 6/2003 | Soucy et al. | 294/99.1 |
| 6,638,389 | B2 * | 10/2003 | Kassir et al. | 156/286 |
| 6,692,049 | B2 * | 2/2004 | Holbrooks | 294/103.1 |
| 6,698,735 | B2 * | 3/2004 | Zywno | 269/21 |
| 6,721,162 | B2 * | 4/2004 | Weldon et al. | 361/234 |
| 6,722,026 | B1 * | 4/2004 | Lent | 29/830 |
| 6,770,167 | B2 * | 8/2004 | Kohinata et al. | 156/379.8 |
| 6,853,533 | B2 * | 2/2005 | Parkhe | 361/234 |
| 6,863,590 | B2 * | 3/2005 | Kobayashi | 451/5 |
| 6,872,439 | B2 * | 3/2005 | Fearing et al. | 428/99 |
| 6,990,737 | B2 * | 1/2006 | Zywno | 29/898.02 |
| 7,008,303 | B2 * | 3/2006 | White et al. | 451/59 |
| 7,080,675 | B2 * | 7/2006 | Yamamoto | 156/538 |
| 7,089,986 | B2 * | 8/2006 | Hayasaka et al. | 156/556 |
| 7,135,081 | B2 * | 11/2006 | Yamamoto | 156/73.6 |
| 7,138,606 | B2 * | 11/2006 | Kanno et al. | 219/390 |
| 7,207,367 | B2 * | 4/2007 | Yamamoto | 156/522 |
| 7,259,106 | B2 * | 8/2007 | Jain | 438/737 |
| 7,276,429 | B2 * | 10/2007 | Yamanaka | 438/455 |
| 7,313,262 | B2 * | 12/2007 | Lin et al. | 382/145 |
| 7,384,811 | B2 * | 6/2008 | Miyamoto et al. | 438/33 |
| 7,393,757 | B2 * | 7/2008 | Miyamoto et al. | 438/460 |
| 7,430,037 | B2 * | 9/2008 | Mochizuki | 355/75 |
| 7,501,605 | B2 * | 3/2009 | Steger et al. | 219/494 |
| 7,691,307 | B2 * | 4/2010 | Fearing et al. | 264/220 |
| 7,766,723 | B2 * | 8/2010 | Mazoyer | 451/5 |
| 7,784,515 | B2 * | 8/2010 | Nonaka et al. | 156/510 |
| 2001/0046112 | A1 * | 11/2001 | Herchen | 361/234 |
| 2002/0048907 | A1 * | 4/2002 | Miyamoto et al. | 438/464 |
| 2002/0050246 | A1 * | 5/2002 | Parkhe | 118/500 |
| 2002/0079714 | A1 * | 6/2002 | Soucy et al. | 294/99.1 |
| 2002/0135969 | A1 * | 9/2002 | Weldon et al. | 361/234 |
| 2002/0173229 | A1 * | 11/2002 | Kobayashi | 451/5 |
| 2003/0079828 | A1 * | 5/2003 | Kassir et al. | 156/230 |
| 2003/0098131 | A1 * | 5/2003 | Hayasaka et al. | 156/537 |
| 2005/0056537 | A1 * | 3/2005 | Chen et al. | 204/229.4 |
| 2005/0064683 | A1 * | 3/2005 | Farnworth et al. | 438/464 |
| 2005/0074952 | A1 * | 4/2005 | Miyamoto et al. | 438/455 |
| 2005/0074954 | A1 * | 4/2005 | Yamanaka | 438/458 |
| 2005/0101103 | A1 * | 5/2005 | Yamamoto | 438/455 |
| 2005/0255675 | A1 * | 11/2005 | Farnworth et al. | 438/460 |
| 2006/0162856 | A1 * | 7/2006 | Murayama et al. | 156/272.2 |
| 2006/0209490 | A1 * | 9/2006 | Nakamura et al. | 361/234 |
| 2006/0219359 | A1 * | 10/2006 | Miyamoto et al. | 156/344 |
| 2006/0231202 | A1 * | 10/2006 | Sakata et al. | 156/344 |
| 2007/0034321 | A1 * | 2/2007 | Glacet et al. | 156/230 |
| 2007/0034322 | A1 * | 2/2007 | Glacet et al. | 156/230 |
| 2007/0113969 | A1 * | 5/2007 | Kitano et al. | 156/275.7 |
| 2007/0193671 | A1 * | 8/2007 | Yamamoto | 156/64 |
| 2007/0193672 | A1 * | 8/2007 | Yamamoto | 156/64 |
| 2007/0227670 | A1 * | 10/2007 | Kobayashi et al. | 156/379.6 |
| 2007/0238264 | A1 * | 10/2007 | Sekiya | 438/460 |
| 2007/0283891 | A1 * | 12/2007 | Okayama | 118/728 |
| 2007/0285870 | A1 * | 12/2007 | Shim | 361/234 |
| 2008/0023149 | A1 * | 1/2008 | Yamamoto | 156/378 |
| 2008/0044258 | A1 * | 2/2008 | Akechi | 414/217.1 |
| 2008/0066849 | A1 * | 3/2008 | Yamamoto | 156/101 |
| 2008/0083736 | A1 * | 4/2008 | Steger et al. | 219/494 |
| 2008/0279659 | A1 * | 11/2008 | Kobayashi | 414/222.01 |
| 2009/0002913 | A1 * | 1/2009 | Naim | 361/234 |
| 2009/0059461 | A1 * | 3/2009 | Yonekura et al. | 361/234 |
| 2009/0065152 | A1 * | 3/2009 | Hwang | 156/391 |
| 2009/0199765 | A1 * | 8/2009 | Bhatnagar | 118/500 |
| 2009/0218560 | A1 * | 9/2009 | Flaim et al. | 257/9 |
| 2010/0078114 | A1 * | 4/2010 | Yamamoto et al. | 156/64 |
| 2010/0099221 | A1 * | 4/2010 | Nakamura | 438/109 |

FOREIGN PATENT DOCUMENTS

| | | |
|---|---|---|
| JP | 2006276669 A * | 10/2006 |
| WO | WO 2006046379 A1 * | 5/2006 |

* cited by examiner

TRANSFERRING DEVICE AND TRANSFERRING METHOD

BACKGROUND OF THE INVENTION

1. Field of the Invention

The present invention relates to a transferring device and a transferring method, in particular, to a transferring device and a transferring method suitable for transferring plate-like member such as a semiconductor wafer and the like as an object.

2. Related Art

Generally, a semiconductor wafer (hereinafter, simply referred to as "wafer") undergo various processes over time such as sticking a protective sheet on the circuit surface side thereof before grinding of the rear surface. Duration of intervals between such processes, transferring operations are involved among placing means of wafer such as tables or the like via an appropriate transferring device or conveyance device.

Patent Document 1 discloses a transferring device having a robot arm that sucks and holds the wafer.

[Patent Document 1] Japanese Patent Application Laid-Open No. 10-242249

However, in the transferring device disclosed in the Patent Document 1, the device is arranged so as to suck and hold wafer. Therefore in the case where the transferring device is used for transferring an ultra-thin wafer that has been achieved recently down to several tens of micron meter in thickness and that the size of plane figure thereof has been upsized in recent years, wafer tends to be cracked due to partial load incurred to the wafer accompanied with sucking, and the peripheral side of the wafer is inclined to be sagged, which causes breakage of the peripheral area thereof because the peripheral area touches the table face firstly when transferring the wafer onto the table.

SUMMARY OF THE INVENTION

The present invention has been proposed in view of the foregoing disadvantages. An object of the present invention is to provide a transferring device and a transferring method suitable for transferring a plate-like member while avoiding damage causes even for the plate-like member such as upsized and ultra-thin wafer and the like.

In order to achieve the above object, the present invention adopts such an arrangement that a transferring device which transfers a plate-like member among a plurality of placing means on which the plate-like member is placed, comprising:

a supporting means provided with a supporting face for the plate-like member; and a moving means to move the supporting means, wherein the supporting face includes a stacked body which is formed by laminating of adhesive sheets so that each adhesive sheet can be peeled off mutually, the adhesive sheet having sheet base material laminated by an adhesive layer, and wherein the plate-like member is transferred among the placing means through sticking and peeling operation of the adhesive sheet, which is outermost layer in the stacked body, to and from the plate-like member.

In the present invention, such an arrangement may be adopted that, when the outermost adhesive sheet to be stuck to the plate-like member suffers from deteriorated adhesive strength, the adhesive sheet is peeled off and a subsequent adhesive sheet is made to be the outermost adhesive sheet.

It is preferable that the supporting face is provided with such dimensions as to be stuck to the whole surface of the plate-like member corresponding to the supporting face.

Further, the supporting means is arranged to include a displacement means to displace partially a surface position of the adhesive sheet with respect to the plate-like member.

In addition, such an arrangement may be adopted that the displacement means displaces the adhesive sheet, when the adhesive sheet is stuck to the plate-like member, so that sticking operation is executed from a central portion toward both edge portions in a side view of the plate-like member synchronously with the moving means.

Furthermore, the displacement means can displace the adhesive sheet, when the adhesive sheet stuck to the plate-like member is peeled off from the plate-like member, so that peeling operation is executed from both edge portions toward a central portion in a side view of the plate-like member synchronously with the moving means.

In addition, the present invention adopts a transferring method for transferring a plate-like member among a plurality of placing means for placing a plate-like member, comprising the steps of:

supporting a stacked body of adhesive sheets by a supporting means which are laminated so that each adhesive sheet can be peeled off mutually, sticking an adhesive layer of an outermost adhesive sheet to the plate-like member placed on a placing means, and supporting the plate-like member;

moving the supporting means to a side of other placing means and placing the plate-like member on the placing means; and subsequently, transferring the plate-like member through peeling of the outermost adhesive sheet from the plate-like member.

In the above transferring method, such a method may be adopted that, when the outermost adhesive sheet to be stuck to the plate-like member suffers from deteriorated adhesive strength, the adhesive sheet is peeled off and a subsequent adhesive sheet is made to be the outermost adhesive sheet.

In addition, in the above transferring method, when sticking the adhesive sheet to the plate-like member, such a method is adopted that sticking is executed from a central portion toward both edge portions in a side view of the plate-like member.

Furthermore, when transferring the plate-like member, such a method is also adopted that the adhesive sheet stuck to the plate-like member is peeled off from both edge portions toward a central portion in a side view of the plate-like member.

According to the present invention, due to the fact that the supporting face of the supporting means has an outermost adhesive sheet of the stacked body, the plate-like member can be supported by sticking the adhesive sheet to the plate-like member. Therefore partial load on the plate-like member that can happen in the case of suction supporting is eliminated and cracks of the plate-like member as well as relative sagging of the peripheral portion can be effectively avoided.

Moreover, when the supporting face is arranged so as to be stuck to the whole surface of the plate-like member corresponding to the same, sagging of the peripheral portion thereof can be securely prevented even for the case where the plate-like member is an ultra-thin type wafer of several tens of micron meter in thickness, which enables to eliminate the peripheral portion damage when placing onto a table.

In addition, in the arrangement that includes a displacement means to displace partially the face position of the adhesive sheet, sticking operation of the adhesive sheet to the plate-like member can be implemented from the central portion thereof toward the both edge portions, for example, in the side view of the plate-like member, whereby air trap between the adhesive sheet and the plate-like member can be eliminated, which enables to support securely.

Meanwhile, when peeling operation is arranged such that the operation is commenced from both edge portions toward central portion of the plate-like member, peeling resistance of the adhesive sheet separation from the plate-like member can be reduced, which enables to peel off easily.

EXPLANATION OF REFERENCE NUMERALS

Figure 1:
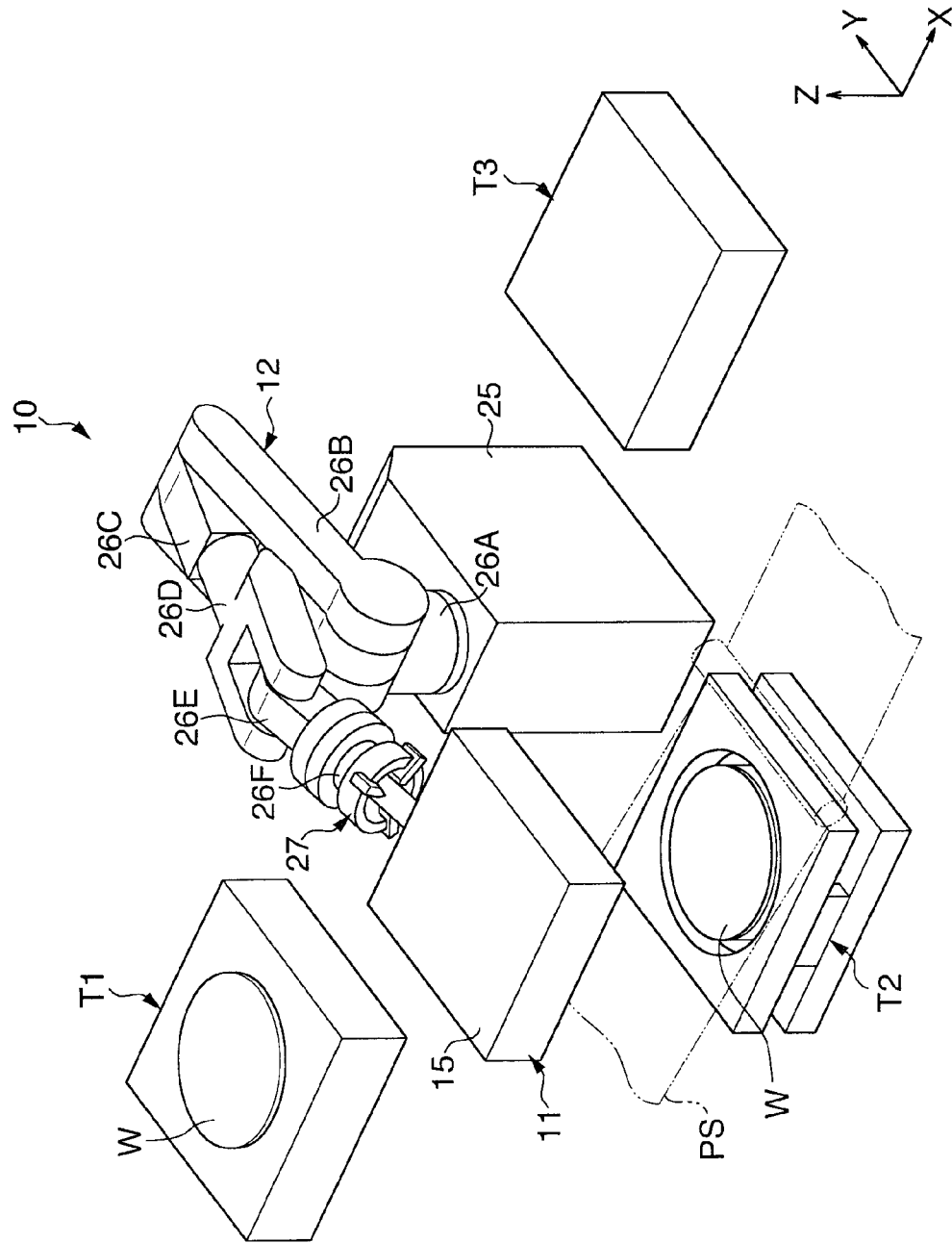
FIG. 1 is a schematic perspective view of the overall structure of a transferring device according to an embodiment of the present invention.

10: transferring device
11: supporting means
12: multi joint robot (moving means)
16: displacement means
T1: first table (placing means)
T2: second table (placing means)
T3: third table (placing means)
A: adhesive layer
S: adhesive sheet
SB: sheet base material
SL: stacked body (supporting face)
W: semiconductor wafer (plate-like member)

DETAILED DESCRIPTION OF THE PREFERRED EMBODIMENT

Now, referring to the drawings, preferred embodiment of the present invention will be described below.

Figure 2:
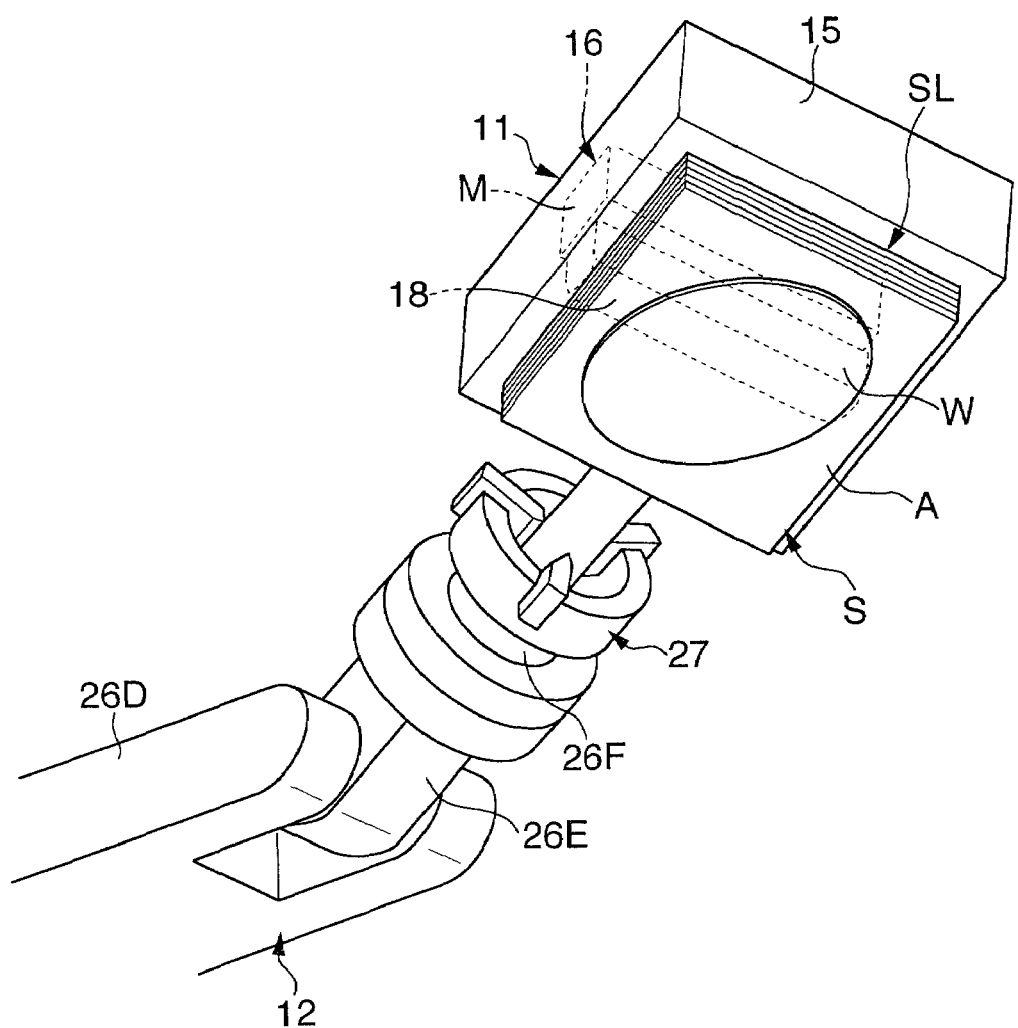
FIG. 2 is a schematic perspective view of the principal part of the transferring device.

FIG. 1 illustrates a schematic perspective view of a transferring device according to the present invention, and FIG. 2 illustrates a schematic perspective view of the principal part of the transferring device. In these drawings, the transferring device 10 is arranged so that a wafer W as a plate-like member is transferred among a first table T1, a second table T2 and a third table T3 which form a placing means. The transferring device 10 includes, as shown in FIG. 2, a supporting means 11 having a stacked body SL of an adhesive sheet S which forms a supporting face for the wafer W, and a multi joint robot 12 as a moving means which moves the supporting means 11 among the tables 1, 2 and 3. As for the adhesive sheet S, as shown in the enlarged portion P of FIG. 3, such a layer structure type adhesive sheet is adopted that an adhesive layer A is overlaid on one side of the piece sheet base material SB. The longitudinal and width dimensions of the adhesive sheet S are arranged to be larger than the maximum dimensions of the wafer W, due to which the adhesive sheet S can be stuck to the whole upper-surface of the wafer W.

Figure 3:
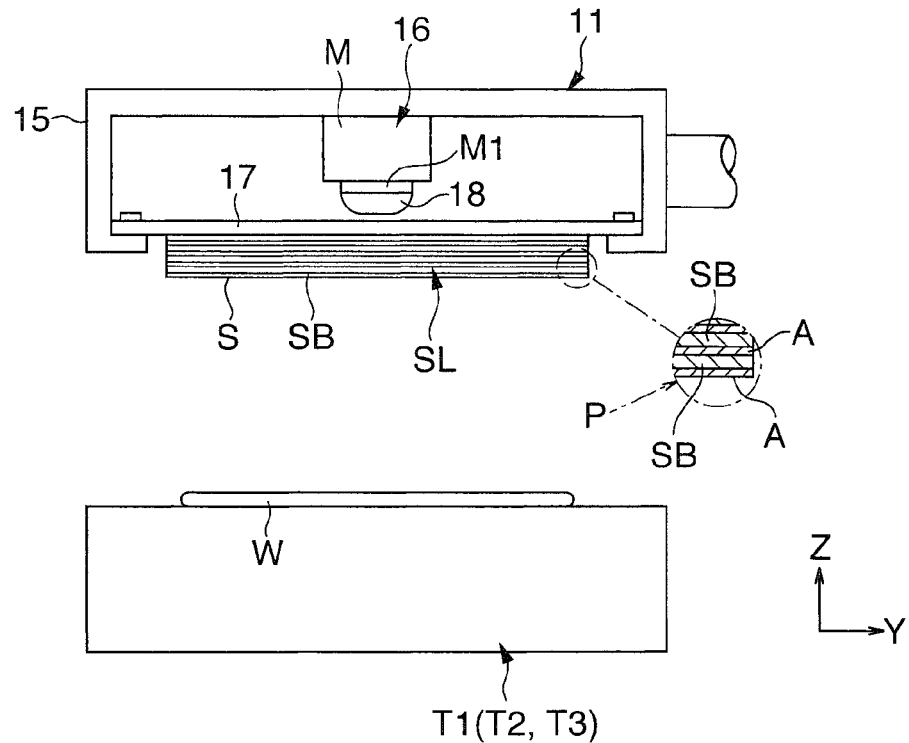
FIG. 3 is a side view illustrating an initial operation of transferring a wafer onto a table.

As shown in FIG. 2 and FIG. 3, the supporting means 11 comprises main body case 15 usually opened downward, a displacement means 16 disposed in the main body case 15 and a stacked body supporting sheet 17 provided so as to substantially close the opening of the body case 15. The displacement means 16 includes a linear motor M fixed at the central portion of the ceiling wall of the body case 15 and a displacement member 18 fixed at the top edge of the rod M1 of the linear motor M, having substantially the same width dimension with that of the width direction of the adhesive sheet S (perpendicular direction to the paper in FIG. 3). The displacement means 16 is arranged so as to depress the stacked body SL from the inner side via the stacked body supporting sheet 17 when the displacement member 18 extends, and thereby the stacked body SL is displaced from the initial flat shape so that the central portion of the adhesive sheet S positioned outermost layer (lowest layer in FIG. 3) in a side view approaches the wafer W relatively with respect to the both side portions thereof.

The multi joint robot 12, as shown in FIG. 1, includes a base portion 25, the first arm 26A through the sixth arm 26F disposed on the upper face side of the base portion 25, and a holding chuck 27 fixed at the edge portion of the sixth arm 26F. The second, the third and the fifth arm 26B, 26C and 26 E are respectively arranged rotatably in a plane Y, Z, and the first, the fourth and the sixth arm 26A, 26D and 26F are arranged rotatably around the respective axis thereof. The multi joint robot 12 is controlled by Numerical Control. That is to say, the movement of each joint with respect to the object is controlled by numerical information corresponding to each joint, and the all movements are controlled by a program.

The multi joint robot 12 in the present embodiment is substantially identical with the one described in the Patent Application 2006-115106 filed already by the applicant of the present invention, whereby detailed description is omitted here.

The first table T1 forming a placing means is to support the wafer W transferred via a conveying arm and the like, not shown, and the wafer W is transferred to the second table T2 via the transferring device 10. Onto the upper face of the wafer W (circuit face) transferred to the second table T2, a strip-like protective sheet PS is provided via a sheet sticking device, not shown, to be stuck. Then the protective sheet PS is cut so as to meet the size of wafer W, in exemplification in substantially round shape, and the wafer W stuck with the protective sheet PS is transferred to the third table T3 via the transferring device 10. The upper surface side of each table, T1 to T3, is arranged to have a sucking function of the wafer W.

Next the transferring method is described about the case of transferring the wafer W from the table T1 to the table T2.

Figure 4:
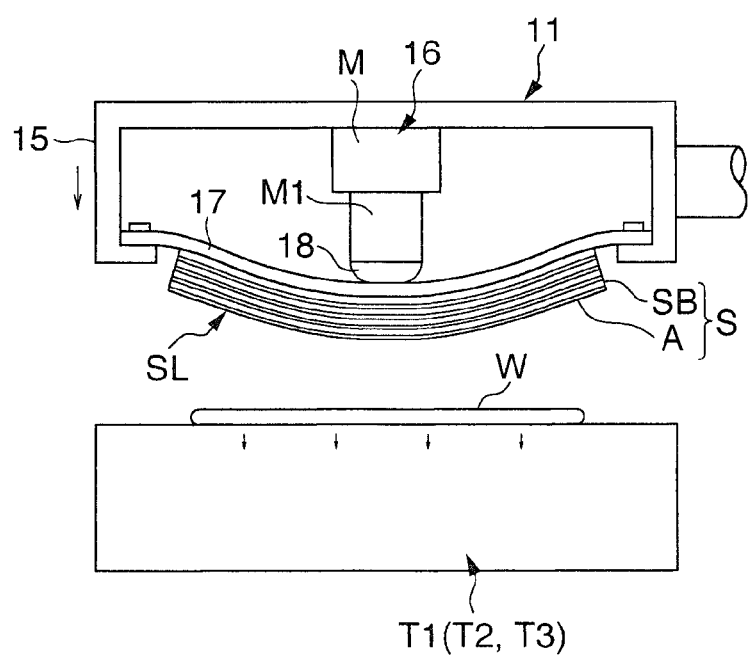
FIG. 4 is a side view illustrating a subsequent operation to the operation in FIG. 3.

When the wafer W supported by the upper face of the table T1 is transferred to be placed on the second table T2 via the transferring device 10, as shown in FIG. 3, the adhesive sheet S supported by the supporting means 11 is positioned to be parallel to the wafer W and descends, via the multi joint robot 12, toward the table T1 in the direction of Z-axis while keeping the parallel condition. In that case, the displacement member 18 is extended via the rod M1 of the linear motor M so that the central portion of the stacked body SL is protruded downwardly from the both sides thereof in a side view (see FIG. 4).

Figure 5:
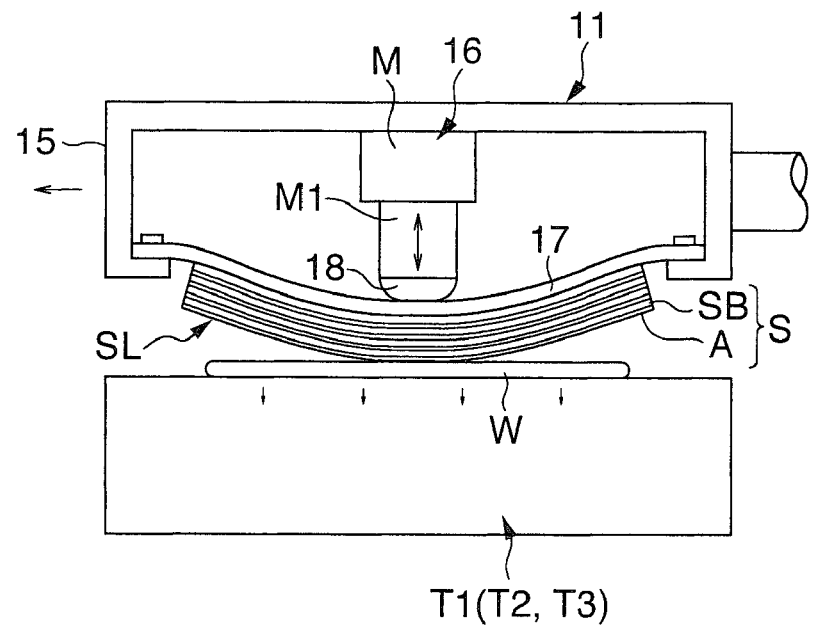
FIG. 5 is a side view illustrating a commencing situation of sticking operation of an adhesive sheet onto the wafer.
Figure 6:
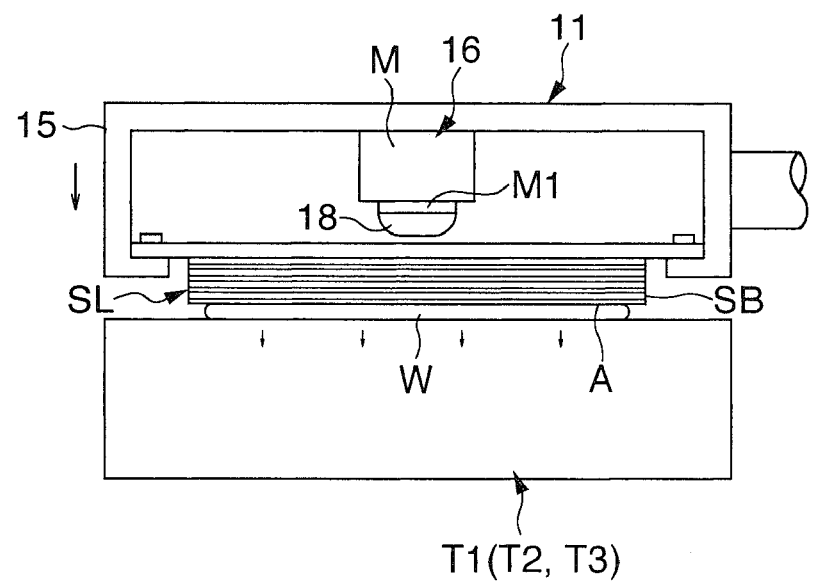
FIG. 6 is a side view illustrating an operation of transferring the wafer to the table or transferring operation from the table.
Figure 7:
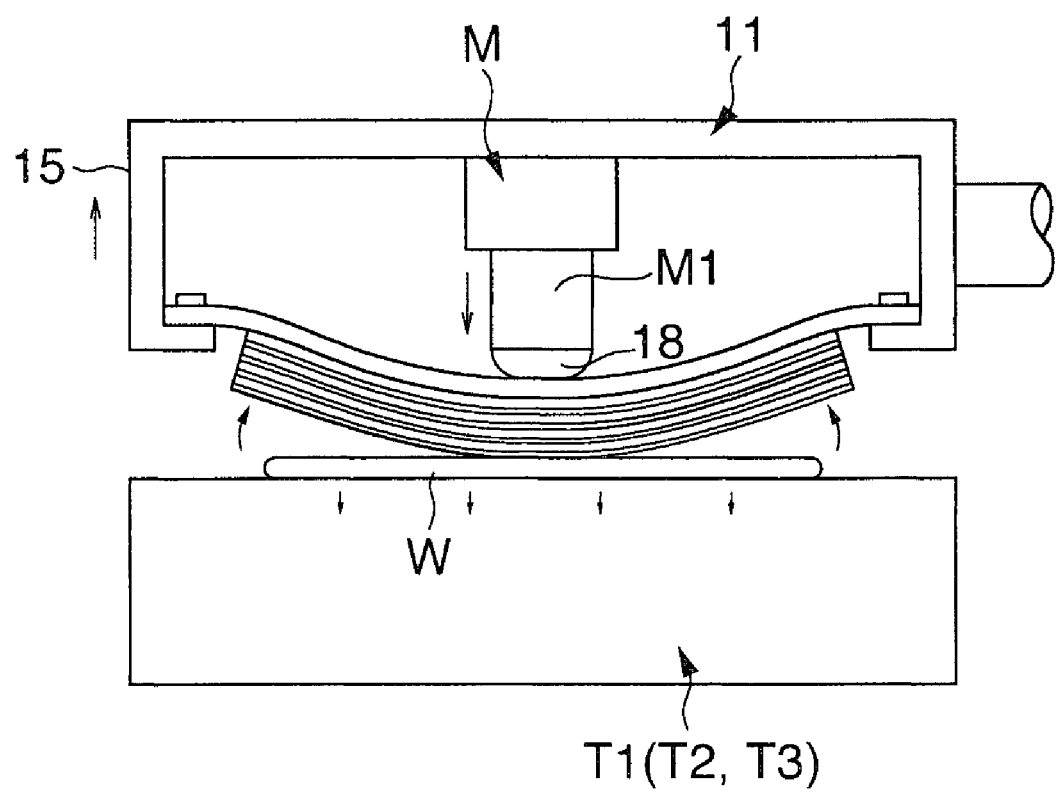
FIG. 7 is a side view illustrating a subsequent operation to the operation in FIG. 6.

When the outermost layer adhesive sheet S is to be stuck to the wafer W supported by the first table T1, as shown in FIG. 5, the adhesive sheet S is stuck to the wafer W from the central portion in a side view of the wafer W, thereafter while the supporting means 11 is lowered via the multi joint robot 12, the rod M1 is retracted in synchronized motion with the movement of the robot 12. Owing to which the area stuck is expanded to the both side up to the situation where the whole area is stuck (see FIG. 6). And then, when the wafer W transferred and supported to the supporting means 11 side is to be transferred to the table T2, the wafer W is placed on the second table T2 while keeping the adhesive sheet S in horizontal posture (while the rod M1 of the linear motor M is in the retracted position). On that occasion, the second table T2 starts sucking and holding operation of the wafer W. Thereafter, as shown in FIG. 7, while the displacement member 18 depresses the stacked body SL toward the side of wafer W, the supporting means 11 is moved upward in synchronized operation with movement of the multi joint robot 12 so as to be separated from the table T2, thus peeling operation of the adhesive sheet S is performed starting from the both right and left sides of the wafer W toward the central portion thereof to separate the adhesive sheet S and the wafer W, whereby transferring operation can be completed.

The upper surface that is the circuit surface of the wafer W transferred to the second table T2 is stuck with a protective sheet PS via a sticking device, not shown. Thereafter, the protective sheet PS is cut in accordance with the size of wafer W, and the wafer W on which the protective sheet PS is stuck is transferred to the third table T3 via the supporting means 11. In that case, the transferring operation is substantially identical with the transferring operation from the first table T1 to the second table T2 apart from the existence of the protective sheet PS between the adhesive sheet S and the wafer W.

The adhesive sheet S in the outermost layer is utilized repeatedly if adhesive strength of the adhesive layer has not been deteriorated. Once the adhesive strength is deteriorated, the adhesive sheet S is peeled off from the stacked body SL to emerge a subsequent adhesive sheet S so as to be utilized for the following transferring operations.

According to the embodiment as described above, since the whole surface of the wafer W corresponding to the adhesive sheet S is stuck with the adhesive sheet S, even if the wafer W is the ultra-thin type ground down to several tens of micron meter in thickness, for example, the wafer W is not suffered from any partial load due to suction, which is the conventional disadvantage, moreover in the transferring operation there is not any sagging problems in peripheral sides whereby the wafer can be transferred without any damage cause on the wafer W which produces a superior effect than ever.

In addition, since the adhesive sheet S in the outermost layer can be utilized continuously in a certain usage limit, running cost can be reduced.

The most preferable arrangements and methods to implement the present invention have been disclosed so far. The present invention, however, is not limited to the above.

That is to say, the present invention has been illustrated and described mainly on specific embodiments. However it is possible for those skilled in the art to add various modifications, if necessary, to the above-described embodiment with respect to shape, quantity, and other detailed arrangement without departing from the technical spirit and the range of the object of the present invention.

Therefore, description disclosed above restricting the shape and the like is exemplified for easy understanding of the present invention, and is not restricting the present invention, accordingly description by the names of components avoiding a part of or the whole restrictions of the shapes and the like is to be involved in the present invention.

For example, in the above embodiments, the adhesive sheet S is illustrated for the case where the shape thereof is square, but the present invention is not limited to that. An adhesive sheet with a similar plane shape to the wafer W may be utilized. And such an adhesive sheet S that the periphery portion thereof is provided with protruded tongues having no adhesive layer may be used, which facilitates the peeling operation of the outermost adhesive sheet S one by one from the stacked body SL by way of nipping the tongues.

Moreover, the plate-like member is not limited to the wafer W but glass plate, steel plate, or resin plate and the like, as well as other plate-like members may be included. And the semiconductor wafer may include silicon wafer and compound wafer.

What is claimed is:

1. A transferring device that transfers a plate-like member among a plurality of placing means on which said plate-like member is placed, comprising:
a supporting means provided with a supporting face for said plate-like member; and a moving means to move the supporting means, wherein said supporting face includes a stacked body which is formed by laminating of adhesive sheets so that each adhesive sheet can be peeled off mutually, the adhesive sheet having sheet base material laminated by an adhesive layer, and wherein said plate-like member is transferred among said placing means through sticking and peeling operation of the adhesive sheet, which is outermost layer in said stacked body, to and from said plate-like member.

2. The transferring device according to claim 1, wherein, when the outermost adhesive sheet to be stuck to said plate-like member suffers from deteriorated adhesive strength, the adhesive sheet is peeled off and a subsequent adhesive sheet is made to be the outermost adhesive sheet.

3. The transferring device according to claim 1 or 2, wherein, said supporting face is provided with such dimensions as to be stuck to whole surface of the plate-like member corresponding to the supporting face.

4. The transferring device according to claim 1 or 2, wherein, said supporting means includes a displacement means to displace partially a surface position of said adhesive sheet with respect to the plate-like member.

5. The transferring device according to claim 4, wherein, said displacement means displaces said adhesive sheet, when said adhesive sheet is stuck to said plate-like member, so that sticking operation is executed from a central portion toward both edge portions in a side view of said plate-like member synchronously with said moving means.

6. The transferring device according to claim 4, wherein, said displacement means displaces said adhesive sheet, when said adhesive sheet stuck to said plate-like member is peeled off from the plate-like member, so that peeling operation is executed from both edge portions toward a central portion in a side view of said plate-like member synchronously with said moving means.

7. A transferring method for transferring a plate-like member among a plurality of placing means for placing a plate-like member, comprising the steps of:
supporting a stacked body of adhesive sheets by a supporting means which are stacked so that each adhesive sheet can be peeled off mutually, sticking an adhesive layer of an outermost adhesive sheet to a plate-like member placed on a placing means, and supporting the plate-like member; moving said supporting means to a side of other placing means and placing plate-like member on the placing means; and subsequently, transferring the plate-like member through peeling of the outermost adhesive sheet from the plate-like member.

8. The transferring method according to claim 7, wherein, when the outermost adhesive sheet to be stuck to said plate-like member suffers from deteriorated adhesive strength, the adhesive sheet is peeled off and a subsequent adhesive sheet is made to be the outermost adhesive sheet.

9. The transferring method according to claim 7 or 8, wherein, when sticking said adhesive sheet to the plate-like member, sticking is executed from a central portion toward both edge portions in a side view of the plate-like member.

10. The transferring method according to claim 7 or 8, wherein, when transferring said plate-like member, the adhesive sheet stuck to the plate-like member is peeled off from both edge portions toward a central portion in a side view of the plate-like member.

* * * * *